(12) United States Patent
Taori

(10) Patent No.: US 7,069,210 B2
(45) Date of Patent: Jun. 27, 2006

(54) METHOD OF AND SYSTEM FOR CODING AND DECODING SOUND SIGNALS

(75) Inventor: Rakesh Taori, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 817 days.

(21) Appl. No.: 09/725,415

(22) Filed: Nov. 29, 2000

(65) Prior Publication Data
US 2001/0013003 A1 Aug. 9, 2001

(30) Foreign Application Priority Data
Dec. 1, 1999 (EP) ................... 99204055

(51) Int. Cl.
*G10L 19/10* (2006.01)

(52) U.S. Cl. ............... 704/220; 704/205; 704/268; 704/211; 704/500

(58) Field of Classification Search ........ 704/500–504, 704/205, 211, 220, 230, 268; 714/755; 370/324
See application file for complete search history.

(56) References Cited

U.S. PATENT DOCUMENTS

| 4,885,790 | A | * | 12/1989 | McAulay et al. | ........... 704/265 |
|---|---|---|---|---|---|
| 5,469,527 | A | | 11/1995 | Drogo De Iacovo et al. | ........... 395/2.29 |
| 5,504,833 | A | * | 4/1996 | George et al. | .............. 704/211 |
| 5,872,531 | A | * | 2/1999 | Johnson et al. | ............. 341/110 |
| 5,917,835 | A | | 6/1999 | Barrett et al. | .............. 371/37.4 |
| 6,266,644 | B1 | * | 7/2001 | Levine | ...................... 704/503 |

* cited by examiner

*Primary Examiner*—Vijay B. Chawan

(57) ABSTRACT

Method of and system for coding a sound signal (10) as multiple independent streams of frames (14, 15) by creating frames (1,2,3,4,5,6) using sinusoidal coding and then placing frame i into stream i modulo the number of streams, method of and system for reconstructing a sound signal (23) by decoding frames from multiple streams (21, 22) in an interleaved fashion and reconstructing missing frames by using information from surrounding frames, system for recording and playing back sound signals implementing the above two methods, where under normal circumstances both streams (31, 32) of a coded signal are stored, and when capacity on the storage medium (35) is low, only one of the two streams of a coded signal is stored while one of the two streams of existing coded signals is overwritten and allowing a decoder (37) to reconstruct a sound signal by using either both or the one available stream for that sound signal.

5 Claims, 1 Drawing Sheet

METHOD OF AND SYSTEM FOR CODING AND DECODING SOUND SIGNALS

The invention relates to a method of coding a sound signal as various streams of frames, in which the sound signal is subdivided into various segments and each segment is coded to a corresponding frame.

The invention further relates to a method of decoding a sound signal which comprises various streams of numbered frames, in which each frame contains information about a segment of the sound signal.

The invention further relates to a system for coding a sound signal as various streams of frames, in which the sound signal is subdivided into various segments and each segment is coded to a corresponding frame.

Furthermore, the invention relates to a system for decoding a sound signal which comprises various streams of numbered frames, in which each frame contains information about a segment of the sound signal.

The invention further relates to a system for recording and reproducing sound signals.

The methods as described in the introductory part are known from U.S. Pat. No. 5,469,527. For sending a sound signal over a network, the sound signal is coded in frames which are subsequently sent to a receiver. Prior thereto there is determined how many bits of information per second are necessary, the so-called bit rate. It is desirable to be able to send a given sound signal to various receivers at different bit rates without having to re-code the sound signal each time. For this purpose, the signal is coded to various streams of frames. The first stream, the base layer, contains the information that is at least necessary for reconstructing the sound signal in an understandable manner. The other streams, the enhancement layers, contain information that can be added to the information from the base layer to thus obtain a better reconstruction of the sound signal.

When the receiver decodes only the base layer, it can obtain a reasonable reconstruction of the sound signal with a minimum amount of information. In addition, it can decode one or more enhancement layers to thus improve the quality of the reconstructed sound signal.

In this decoding method the base layer is necessary for reconstructing the sound signal. A drawback of the known decoding method is that the omission of the base layer results in that the sound signal can no longer be reconstructed.

It is an object of the invention to provide a method of coding a sound signal of the type defined in the opening paragraph, in which the omission of a stream has less consequence for the reconstruction of the sound signal.

This object is achieved by the coding method according to the invention in that the sound signal is represented as a set of sine waves defined by their amplitude and frequency, in that the amplitude and the frequency of each sine wave in a segment are stored in a frame corresponding to this segment, independently of other segments, and in that the frames thus obtained are numbered and subdivided into n streams, where frame number i is subdivided into stream i modulo-n.

The information in each frame is independent of the information in any other frame. In consequence, it is possible to decode all the frames and thus all the streams independently of each other. Each stream misses about equally many frames, so that the reconstruction of the sound signal from each stream will yield about the same quality. In each stream the information may be obtained from the missing frames by interpolating the information from the available frames.

An advantage of this coding method is that all the streams may now be used as base layers, so that it is still possible to reconstruct the original sound signal after the loss or mutilation of an arbitrary stream. Another advantage of this coding method is that the differences of Quality of Service may optionally be increased or reduced by varying the number of streams. The larger n is selected to be, the more variation in quality is possible. Another advantage of this coding method is that the total redundancy of information is less than in the known coding method, because the information from each frame is now stored in more than one layer.

In a particular embodiment of the invention, also the phase of each sine wave in a segment is stored in the frame corresponding to this segment. The advantage of this embodiment is that the reconstruction of the sound signal is then of a still better quality.

In a particular embodiment of the coding method, n equals 2. The advantage of this embodiment is that the division of frames into two streams can be realized very simply and that the information missing in each stream is so little that the difference between reconstructed and original sound signal is hardly audible when only one of the two streams is used during the reconstruction.

It is also an object of the invention to provide a method of decoding a sound signal of the type defined in the introductory part, in which the sound signal can be reconstructed separately from each stream.

With the decoding method according to the invention this object is achieved in that an arbitrary stream is selected from the streams of frames, after which the sound signal is reconstructed by generating sine waves for each segment of the sound signal for which a corresponding frame is present in the selected stream, which sine waves are based on the information in the corresponding frame, and generating sine waves for each segment of the sound signal for which no corresponding frame is present in the selected stream, which sine waves are based on the information in the frames corresponding to a segment selected from a segment immediately preceding and a segment immediately following the respective segment.

An advantage of this decoding method is that the original sound signal can now be reconstructed if one or more streams are missing or frames therefrom are missing or are received mutilated. As long as a frame from at least one stream is correctly received, the associated part of the original sound signal can be reconstructed.

In a particular embodiment of the decoding method sine waves are generated for a segment of the sound signal for which no corresponding frame occurs in the selected stream, but for which a corresponding frame does occur in another stream, which sine waves are based on the information in the corresponding frame from the other stream.

In this embodiment the frames from two or more streams are combined during the reconstruction. This is advantageous in that less information needs to be derived from frames corresponding to preceding or previous segments, so that the reconstruction is of a better quality.

It is also an object of the invention to provide a system for coding a sound signal of the type defined in the introductory part in which a stream being lost has less consequence for the reconstruction of the sound signal.

This object is achieved with the coding system according to the invention in that the coding system comprises means for representing a sound signal as a set of sine waves defined by their amplitude and frequency, and for storing the amplitude and frequency of each sine wave in a segment in a frame that corresponds to this segment, independently of other segments, and for numbering the thus obtained frames and subdividing them into n streams, where frame number i is assigned to stream i modulo-n.

In a particular embodiment of the coding system, the coding system also includes means for storing the phase of each sine wave in a segment in the frame corresponding to this segment. The advantage of this embodiment is that the reconstruction of the sound signal then has an even better quality.

In a particular embodiment of the coding system n equals two. The advantage of this embodiment is that the division of frames into two streams can be realized in a very simple manner and that the information missing in each stream is so little that the difference between reconstructed and original sound signal is hardly audible when only one of the two streams is used for the reconstruction.

It is likewise an object of the invention to provide a system for decoding a sound signal of the type defined in the opening paragraph, in which the sound signal can be reconstructed separately from each individual stream.

With the decoding system according to the invention this object is achieved in that the system is arranged for selecting an arbitrary stream from the streams of frames and then reconstructing the sound signal by generating sine waves for each segment of the sound signal for which a corresponding frame is present in the selected stream, which sine waves are based on the information in the corresponding frame, and for generating sine waves for each segment of the sound signal for which no corresponding frame is present in the selected stream, which sine waves are based on the information in the frames corresponding to a segment selected from a segment immediately preceding and a segment immediately following the respective segment.

In a particular embodiment the decoding system is also arranged for generating sine waves for a segment of the sound signal for which a corresponding frame does not occur in the selected stream, but for which a corresponding frame does occur in another stream, which sine waves are based on the information in the corresponding frame from the other stream.

In this embodiment the frames from two or more streams are combined during the reconstruction. This is advantageous in that less information needs to be derived from frames corresponding to preceding or previous segments, so that the reconstruction has a better quality.

It is likewise an object of the invention to provide a system for recording and playing back sound signals of the type defined in the opening paragraph, in which the capacity of a storage medium can be extended in case of insufficient free space.

This object is achieved with a recording and playback system according to the invention in that the system comprises a coder according to the invention, a storage system and a decoder according to the invention, in which the coder is arranged for applying two streams of frames to the storage system;

the storage system comprises a storage medium divided into at least a first and a second part, the storage system being arranged for being in one of the two states: initially in a state A for storing the one stream offered by the coder in the first part of the storage medium and the other stream offered by the coder in the second part, and when the available free space on the storage medium falls short of a predefined limit, in a state B in which the first part of the storage medium is no longer used for storing the offered streams, and the second part of the storage medium is intended to store one of the two offered streams while a stream stored in the second part in state A is overwritten; and the decoder is arranged for receiving two streams of frames from the storage medium if the storage system is in state A and for receiving one stream from one of the parts of the storage medium if the storage system is in state B.

The invention can be applied to a Voice-over IP telephony system. The receiver receives the speech signal from the transmitter in various streams and can decode them together to recover the original signal. This is advantageous in that the receiver, when receiving a second call, can at least halve the bandwidth of the first call so as to make room for the second call.

The invention can also be applied to radio broadcasts over a network. A transmitter can offer the broadcast in a number of streams, so that a sufficiently large variation of quality is possible. A listener can then select the number of streams he wishes to receive, for example, on the basis of the bandwidth available to him or on the basis of the price which the transmitter charges for transmitting a stream. This provides the possibility of a variable Quality of Service.

These and other aspects of the invention are apparent from and will be elucidated with reference to the embodiments described hereinafter.

Figure 1:
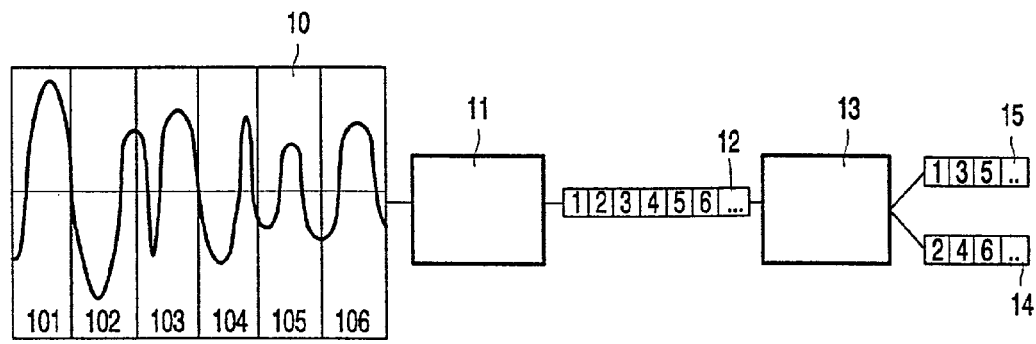
FIG. 1 is a diagrammatic representation of the method of coding a sound signal in various streams of frames according to the invention.

In FIG. 1 a coder 11 receives a sound signal 10 and divides this into various segments. In FIG. 1 they have the same length, for example, 10 ms. The sound signal 10 is represented as a set of sine waves defined by their amplitude and frequency. The coder 11 codes each segment 101, 102, 103, 104, 105 and 106 to a corresponding frame 1, 2, 3, 4, 5, 6 respectively, by storing the amplitude and frequency of each sine wave in a segment irrespective of other segments in a frame corresponding to that segment. For enabling a reconstruction of a better quality, the coder 11 can also determine for each sine wave in a segment 101 and 102, 103, 104, 105, 106 the phase thereof in the frame 1, 2, 3, 4, 5, 6 respectively, corresponding to that segment. This coding method is extensively described in patent application IB 98/00871 published as WO 99/03095 (PHN 16.459) by the same applicants as the present application.

The frames 1, 2, 3, 4, 5, 6 thus obtained from the output stream 12 are numbered. A splitter 13 then splits up the frames 1, 2, 3, 4, 5, 6 into n streams 14 and 15, where frame number i is assigned to stream i modulo-n. For, for example, n=2, all the even-numbered frames come in the first stream 14 and all odd-numbered frames in the second stream 15. For, for example, n=3, the first stream contains the frames numbered 3, 6, 9, . . . , the second stream the frames numbered 1, 4, 7, . . . and the third stream the frames numbered 2, 5, 8, . . . The streams 14 and 15 may subsequently be separately transmitted, stored or used in another way.

Figure 2:
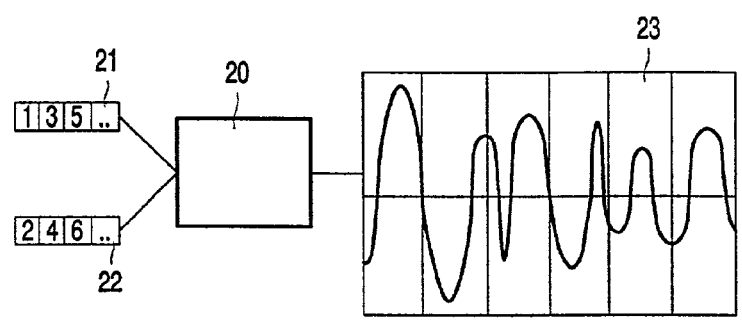
FIG. 2 is a diagrammatic representation of the method of decoding various streams of frames according to the invention.

In FIG. 2 a decoder 20 receives one or more streams of frames 21, 22 which are coded as described with respect to FIG. 1, and selects therefrom an arbitrary stream. It then generates a reconstruction 23 of the original sound signal 10. For each segment of the sound signal for which a corresponding frame is present in the selected stream, the decoder 20 generates sine waves based on the information in the corresponding frame. This information contains the amplitude and frequency of the sine waves to be generated. Also the phase of the sine waves to be generated can be stored in the frame.

For each segment of the sound signal for which no corresponding frame is present in the selected stream, the decoder 20 generates sine waves based on the information in the frames corresponding to a segment selected from a segment immediately preceding and a segment immediately following the respective segment. The decoder can use this information in various ways. A possibility is interpolating the sound signal from the previous and the next segment to the missing segment. This is possible because each segment can be reconstructed independently and thus the segment following the missing segment can be reconstructed previous to the reconstruction of the missing segment itself.

Another possibility is to decode the frame corresponding to the previous segment with a doubled time scale. The thus obtained segment then has a double length compared to normal segments and overlaps then both the previous and present, missing segment.

The decoder 20 can also generate sine waves for a sound signal segment for which no corresponding frame is present in the selected stream, but for which there is a corresponding frame present in another stream, which sine waves are generated on the basis of the information in the corresponding frame from the other stream. In this embodiment the decoder 20 is to determine for each segment of the sound signal to be reconstructed in which of the offered streams the corresponding frame can be found. The number of the desired stream is simply the number of the wanted frame modulo the number of streams. With two streams, all the frames having an even number are in one stream which in FIG. 2 is stream 22, and all the frames having an odd number are in another stream which in FIG. 2 is stream 21.

Figure 3:
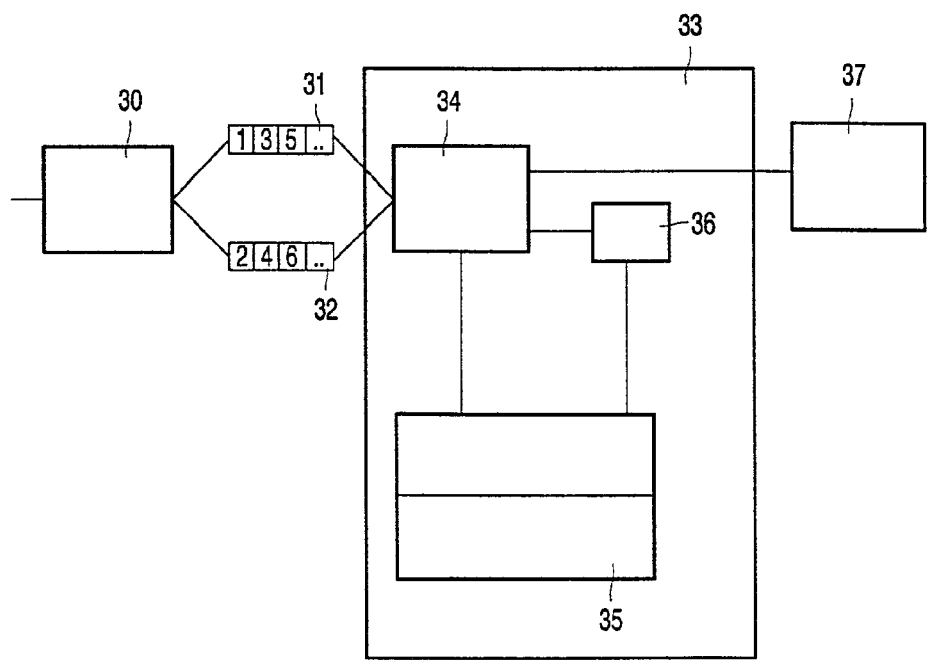
FIG. 3 shows a diagrammatic representation of a system for recording and playing back sound signals according to the invention.

FIG. 3 describes an answering machine which utilizes the methods from the previous two Figures. A coder 30 receives a sound signal from a telephone set, dictaphone or comparable device and codes this to two streams of frames 31 and 32 as described with respect to FIG. 1. The coder 30 then offers these two streams of frames 31 and 32 to a storage system 33. The storage system 33 comprises a control unit 34, a storage medium 35 and a measuring device 36. The storage medium 35, for example, a solid state memory, a hard drive or a cassette tape, is subdivided into at least a first and a second part, each part being suitable for storing streams of frames. The measuring device 36 determines the amount of free space on the storage medium 35.

The storage system 33 may be in one of the two states, A or B. Initially, the storage system 33 is in state A. The control unit 34 in this state stores the stream 31 in the first part of the storage medium and stream 32 in the second part of the storage medium 35. The control unit 34 also stores control information with which every stream can be read back separately. The control unit 34 can keep, for example, an index containing the spot on the storage medium 35 where every stored stream begins, or store the streams sequentially, separated by a mark that can be detected when read back.

When the amount of free space on the storage medium 35 drops below a predefined limit which is set, for example, by the user, or is dependent on the number of messages or the total length of all the messages, the measuring device 36 sends a signal to the control unit 34. The storage system 33 then changes to a state B in which the first part of the storage medium is no longer used for storing offered streams, and the second part of the storage medium is used for storing either of the two applied streams while overwriting thereby a stream that is stored in the second part in state A. However, this has no consequences for the reconstruction of the sound signal that belongs to this stream. For each stream that is stored in the second part in state A, also a corresponding stream is stored in the first part. This stream is not overwritten in state B and, therefore, remains available for reconstructing the respective sound signal.

If a user wishes to listen to a sound signal, the control unit 34 reads the necessary streams of frames from the storage medium 35 and sends them to the decoder 37. The decoder 37 receives two streams of frames from the storage medium 35 if the storage system 33 is in state A and one stream of frames from one of the parts of the storage medium 35 if the storage system 33 is in state B. Subsequently, the decoder 37 decodes the received frames as is described with reference to FIG. 2.

The invention claimed is:

1. A method of decoding a sound signal comprising the steps of; selecting a stream, which includes a plurality of frames, in which each frame contains information about a segment of the sound signal independent of other segments and the frames are subdivided into n streams;
generating sine waves for each segment of the sound signal for which a corresponding frame is present in the selected stream, which sine waves are based on the information in the corresponding frame; and
generating sine waves for each segment of the sound signal for which no corresponding frame is present in the selected stream, which sine waves are based on the information in the frames corresponding to a segment selected from a segment immediately preceding and a segment immediately following the respective segment, thereby reconstructing the sound signal.

2. The decoding method as claimed in claim 1, wherein the sine waves are generated for a segment of the sound signal for which no corresponding frame occurs in the selected stream, but for which a corresponding frame does occur in another stream, which sine waves are based on the information in the corresponding frame from the other stream.

3. A system for decoding a sound signal comprising:
a processor configured to select a stream of numbered frames of a plurality of streams, in which each frame contains information about a segment of the sound signal independent of other segments and the frames are subdivided into n streams, and generate sine waves for each segment of the sound signal for which a corresponding frame is present in the selected stream, which sine waves are based on the information in the corresponding frame, and generate sine waves for each segment of the sound signal for which no corresponding frame is present in the selected stream, which sine waves are based on the information in the frames corresponding to a segment selected from a segment immediately preceding and a segment immediately following the respective segment.

4. The decoding system as claimed in claim 3, wherein the decoding system is also arranged for generating sine waves for a segment of the sound signal for which a corresponding frame does not occur in the selected stream, but for which a corresponding frame does occur in another stream, which sine waves are based on the information in the corresponding frame from the other stream.

5. A system arranged for recording and playing back sound signals, comprising a coder, a storage system, and the decoder of claim 4, in which:

the coder is arranged for applying two streams of frames to the storage system;

the storage system comprises a storage medium divided into at least a first and a second part, the storage system being arranged for being in one of the two states;

initially in a state A for storing the one stream offered by the coder in the first part of the storage medium and the other stream offered by the coder in the second part, and when the available free space on the storage medium falls short of a predefined limit, in a state B, in which the first part of the storage medium is no longer used for storing the offered streams, and the second part of the storage medium is intended to tore one of the two offered streams while a stream stored in the second part in state A is overwritten; and, the decoder is arranged for receiving two streams of frames from the storage medium if the storage system is in state A and for receiving one stream from one of the parts of the storage medium if the storage system is in state B.

\* \* \* \* \*